(12) United States Patent
Nakanishi

(10) Patent No.: US 8,330,421 B2
(45) Date of Patent: Dec. 11, 2012

(54) BATTERY PACK MANAGER

(75) Inventor: Toshiaki Nakanishi, Toyohashi (JP)

(73) Assignee: Panasonic EV Energy Co., Ltd., Kosai-shi (JP)

( * ) Notice: Subject to any disclaimer, the term of this patent is extended or adjusted under 35 U.S.C. 154(b) by 375 days.

(21) Appl. No.: 12/842,561

(22) Filed: Jul. 23, 2010

(65) Prior Publication Data
US 2011/0025270 A1  Feb. 3, 2011

(30) Foreign Application Priority Data

Jul. 29, 2009  (JP) ................................ 2009-176331

(51) Int. Cl.
*H02J 7/00* (2006.01)
(52) U.S. Cl. ........................................ 320/132; 320/116
(58) Field of Classification Search .......... 320/116–122, 320/152, 157–159, 162–164, 132; 324/429, 324/433, 434; 180/65.1, 65.21, 65.29
See application file for complete search history.

(56) References Cited

U.S. PATENT DOCUMENTS 6,750,631 B2 * 6/2004 Perelle .......................... 320/116
7,598,708 B2 * 10/2009 Kimura et al. ................ 320/132
2006/0012337 A1  1/2006 Hidaka
2007/0268000 A1  11/2007 Kobayashi

FOREIGN PATENT DOCUMENTS

| JP | 2006-29895 A | 2/2006 |
| JP | 2007-278913 A | 10/2007 |
| JP | 2007-282413 A | 10/2007 |

* cited by examiner

*Primary Examiner* — Richard V Muralidar
(74) *Attorney, Agent, or Firm* — Christensen O'Connor Johnson Kindness PLLC

(57) ABSTRACT

An apparatus for lessening variations in a state of charge (SOC) or remaining capacity of a battery pack. The battery pack is made up of a plurality of blocks, and slave units are provided for the respective blocks. Terminal voltages of the blocks are detected and supplied to a master unit. Variations arise in a state of charge or remaining capacity of the respective blocks for reasons of differences among the slave units in terms of electric power consumption. The master unit controls deactivation timing of the respective slave units incidental to turning off of a vehicle ignition according to the variations in the state of charge of the respective blocks. The deactivation timing is delayed much longer with an increase in the state of charge, thereby equalizing the state of charge or the remaining capacity.

9 Claims, 12 Drawing Sheets

BATTERY PACK MANAGER

PRIORITY INFORMATION

This application claims priority to Japanese Patent Application No. 2009-176331, filed on Jul. 29, 2009, which is incorporated herein by reference in its entirety.

BACKGROUND

1. Technical Field

The present invention relates to a battery pack manager.

2. Background Art

A battery pack comprised of nickel-metal hydride batteries has hitherto been used as a power source for a motor in a motor vehicle, like a hybrid electric vehicle and a pure electric vehicle, or as a drive source for a load. A lithium ion battery exhibits higher energy density than that exhibited by other secondary batteries and is also superior to the other secondary batteries in terms of charging and discharging efficiency. For these reasons, substitution of nickel-metal hydride batteries for lithium ion batteries is under consideration.

A battery pack built in a motor vehicle is made by connecting a plurality of blocks in series, and each of the blocks is further made by connecting a plurality of battery cells in series. In order to control a state of the battery pack or detect an anomaly in the battery pack, a manager is provided on a per-block basis, thereby detecting voltages of the battery cells.

A disclosure of JP 2006-29895 A is series-connected or so-called stacked use of a required number of integrated circuits for use in monitoring a battery voltage. Specifically, a first integrated circuit and a second integrated circuit are provided for series-connected eight battery cells. Provided that the first integrated circuit is a high level integrated circuit and that the second integrated circuit is a low level integrated circuit, each of the high level integrated circuit and the low level integrated circuit has, as power terminals, a VDD terminal that is a terminal of the highest electric potential VDD and a VSS terminal that is a terminal of the lowest electric potential VSS. The VSS terminal of the high level integrated circuit and the VDD terminal of the low level integrated circuit are commonly connected together. By way of a resistive potential dividing circuit, a signal output terminal SOUT of the high level integrated circuit and a reference voltage terminal REFU of the low level integrated circuit are connected together between the high level integrated circuit and the low level integrated circuit. A divided potential output terminal of the resistive potential dividing circuit is connected to a signal input terminal SIN of the low level integrated circuit. The configuration makes it possible to transmit details of a cell anomaly detected by the high level integrated circuit to a controller by way of the low level integrated circuit.

A disclosure of JP 2007-282413 A includes taking a voltage across both ends of the battery cells of any block in the battery pack into a flying capacitor by means of selective activation of a switching element and further into a microcomputer; managing a state of the battery cells by a management unit provided on a per-block basis; and discharging the battery cells by the respective management units.

Incidentally, the management unit (an integrated circuit) that detects a voltage of each of the blocks making up the battery pack operates upon receipt of a power supply from a secondary battery that is an object of management. Because of variations in electric power consumed by the plurality of management units, variations often arise in a state of charge (SOC) of the blocks making up the battery pack.

SUMMARY

The present invention provides an apparatus that lessens variations in a state of charge (SOC) of blocks making up a battery pack.

The present invention provides a manager that manages a state of charge of a battery pack, comprising: a plurality of low level control means that control respective series-connected battery blocks making up the battery pack and that are supplied with electric power respectively from the plurality of battery blocks; and high level control means that controls delays in deactivation timing of the respective low level control means incidental to turning off of an ignition subsequent to halting of a vehicle according to variations in state of charge of the battery blocks to be controlled respectively by the plurality of low level control means and that performs control such that the delay time increases with an increase in the state of charge. The state of charge of the battery pack mentioned in connection with the present invention may also be remaining capacity.

In the present invention, the plurality of low level control means each can detect terminal voltages of battery cells making up the battery blocks to be controlled by the low level control means and supply the detected terminal voltages to the high level control means, and the high level control means can detect variations in the state of charge according to the terminal voltages of the battery blocks.

Further, in the present invention, the manager can further comprise storage means that stores a correlation between a degree of variation in the state of charge of the battery blocks and the delay time, and the high level control means can control respective deactivation timings of the plurality of low level control means by use of the correlation stored in the storage means.

Moreover, in the present invention, each of the plurality of low level control means can have a timer, commence measurement when an ignition is turned off, and stop operation of the low level control means at a point in time when a timer value of the timer has come to a predetermined value, and the high level control means can set the predetermined value for each of the timers according to variations in the state of charge and supply the set predetermined value to each of the low level control means.

In the present invention, deactivation of the plurality of low level control means corresponds to stoppage of an operation clock signal to the respective low level control means.

The present invention makes it possible to lessen variations in a state of charge or remaining capacity of a battery pack that arise for reasons of differences among a plurality of low level control means in terms of electric power consumption.

The invention will be more clearly comprehended by reference to the embodiment provided below. However, the scope of the invention is not limited to the embodiment.

BRIEF DESCRIPTION OF THE DRAWINGS

A preferred embodiment of the present invention will be described in detail by reference to the following drawings, wherein.

DETAILED DESCRIPTION

Figure 1:
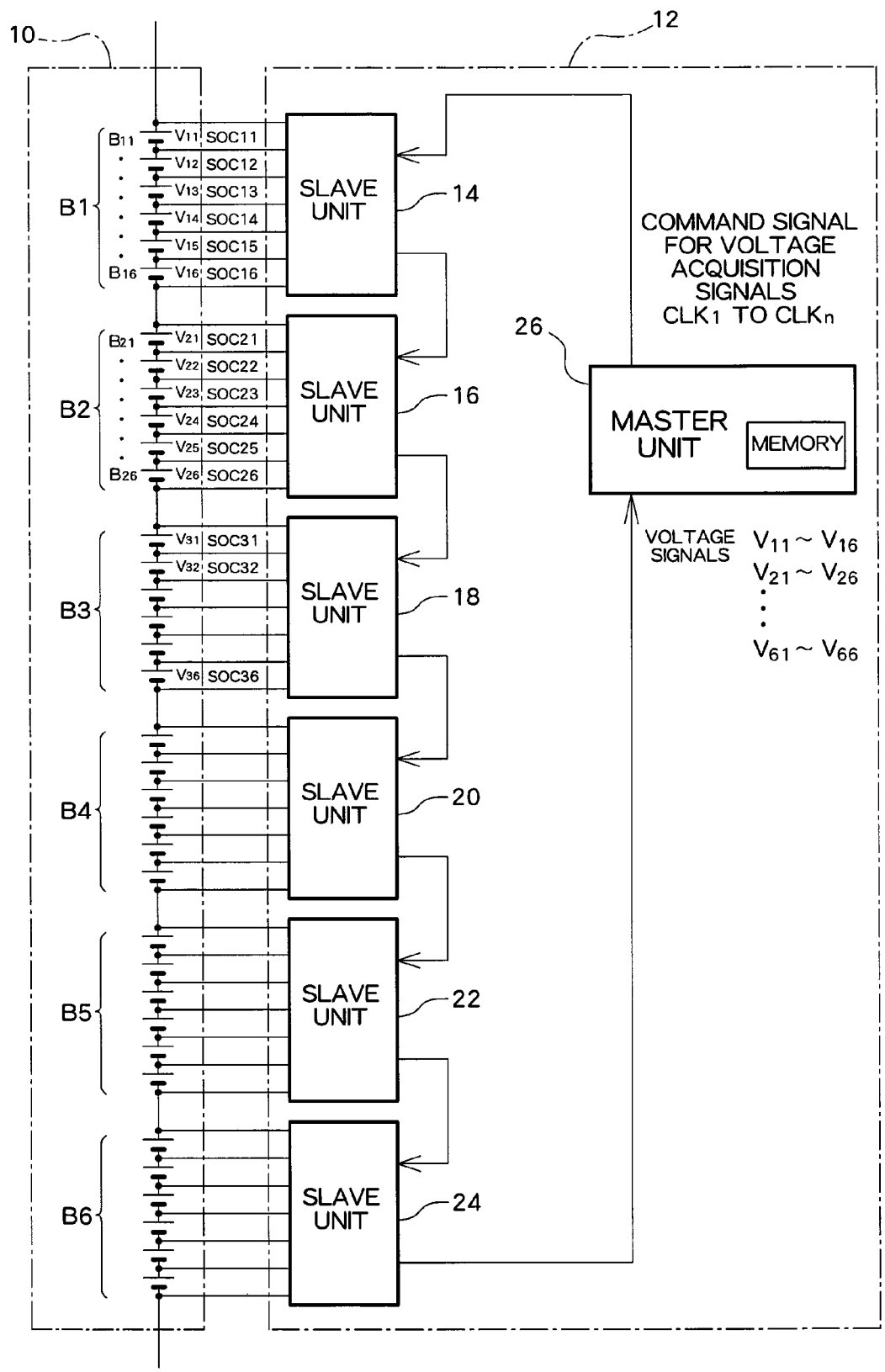
FIG. 1 is a structural block diagram of a battery pack manager of an embodiment.

FIG. 1 shows a structural block diagram of an entire battery pack manager of an embodiment. A manager 12 is provided for a battery pack 10.

The battery pack 10 is built by connecting a plurality of battery blocks B1 through B6 (the battery blocks will hereinbelow be referred to simply as "blocks") in series. For instance, each of the blocks B1 through B6 is built by series connection of at least one battery cell (cell) or more. In the present embodiment, each block is made up of six battery cells. For instance, the block B1 is built by connecting six battery cells B11 to B16 in series, and the block B2 is built by connecting six battery cells B21 to B26 in series. In a battery cell Bij, an alphabetical subscript "i" denotes a block number and another alphabetical subscript "j" denotes a battery cell number in a block Bi. Therefore, a battery cell B44 shows a fourth battery cell in the block B4.

The manager 12 includes a master unit 26 serving as high level control means and a plurality of slave units 14, 16, 18, 20, 22, and 24 serving as low level control means that operate in accordance with a command from the master unit 26. The slave units 14, 16, 18, 20, 22, and 24 are provided in a total number of six in correspondence with the respective blocks B1 to B6 of the battery pack 10, thereby controlling (managing) the respective blocks B1 to B6. Specifically, the slave unit 14 is provided for the block B1; the salve unit 16 is provided for the block B2; the slave unit 18 is provided for the block B3; the salve unit 20 is provided for the block B4; the slave unit 22 is provided for the block B5; and the slave unit 24 is provided for the block B6. Each of the slave units 14, 16, 18, 20, 22, and 24 detects terminal voltages of the respective battery cells in the block that is an object of management. A terminal voltage of the battery cell Bij is herein taken as Vij. The slave unit 14 detects terminal voltages V11 to V16 of the battery cells B11 to B16 in the block B1. A terminal voltage of the battery cell B11 is herein taken as V11; a terminal voltage of the battery cell B12 is taken as V12; and the same also applies to the other battery cells in the block. The slave unit 16 detects terminal voltages V21 to V26 of battery cells B21 to B26 in the block B2. A terminal voltage of the battery cell B21 is herein taken as V21; and a terminal voltage of the battery cell B22 is taken as V22; and the same also applies to the other battery cells in the block. The slave unit 24 detects terminal voltages V61 to V66 of battery cells B61 to B66 in the block B6. A terminal voltage of the battery cell B61 is herein taken as V61; a terminal voltage of the battery cell B62 is taken as V62; and the same also applies to the other battery cells in the block.

The slave units 14, 16, 18, 20, 22, and 24 are connected together in series (or in the form of a daisy chain connection). A terminal voltage is sequentially transmitted as digital data from the high level slave unit to the low level slave unit. In the following descriptions, for the sake of convenience, the slave unit 14 is taken as a high level, and the slave unit 24 is taken as a low level. In accordance with a voltage acquisition signal from the master unit 26, the slave unit 14 detects the respective terminal voltages V11 to V16 of the block B1 that is an object of management; outputs the thus-detected voltages from an output terminal; and supplies the thus-detected voltages to an input terminal of the salve unit 16 that is a low level unit on the next stage. The slave unit 16 detects the respective terminal voltages V21 to V26 of the block B2 that is an object of management; outputs the thus-detected terminal voltages V21 to V26 from an output terminal along with the terminal voltages V11 to V16 supplied from the slave unit 14; and supplies the thus-output terminal voltages to an input terminal of the slave unit 18 that is a low level unit on the next stage. The slave unit 18 detects respective terminal voltages V31 to V36 of the block B3 that is an object of management; outputs the thus-detected terminal voltages V31 to V36 from an output terminal along with the terminal voltages V11 to V16 and V21 to V26 supplied from the slave unit 16; and supplies the thus-output terminal voltages to an input terminal of the slave unit 20 that is a low level unit on the next stage. The terminal voltages are transmitted in like a manner in sequence of the slave unit 14, the slave unit 16, the slave unit 18, the slave unit 20, the slave unit 22, and the slave unit 24. The slave unit 24 detects the respective terminal voltages V61 to V66 of the block B6 that is an object of management of the slave unit 24; outputs the thus-detected terminal voltages V61 to V66 from an output terminal along with the terminal voltages V11 to V16, V21 to V26, V31 to V36, V41 to V46, and V51 to V56 supplied from the slave unit 22; and supplies the thus-output terminal voltages to the master unit 26 as serial data.

The master unit 26 controls the slave units 14, 16, 18, 20, 22, and 24 in a centralized manner. The master unit 26 outputs a voltage acquisition signal at a predetermined timing to the slave units 14, 16, 18, 20, 22, and 24. The voltage acquisition signals are sequentially received by the respective slave units 14, 16, 18, 20, 22, and 24. The respective slave units 14, 16, 18, 20, 22, and 24 detect terminal voltages of the blocks B1 to B6 managed thereby according to the thus-received voltage acquisition signal. Although the master unit 26 and the slave units 14, 16, 18, 20, 22, and 24 are connected to each other in the form of a daisy chain. Timing at which the master unit 26 outputs a signal and timing at which the respective slave units 14, 16, 18, 20, 22, and 24 and the master unit 26 receive signals are substantially identical with each other. Specifically, timings at which the respective slave units 14, 16, 18, 20, 22, and 24 acquire terminal voltages of the blocks to be managed by the respective slave units in accordance with the voltage acquisition signal from the master unit 26 are substantially identical with each other. The master unit 26 outputs to the respective slave units 14, 16, 18, 20, 22, and 24 a command signal that controls timing of an operation clock signal CLK for each of the slave units 14, 16, 18, 20, 22, and 24. The timing of the operation clock signal CLK is specifically timing at which an oscillator (OSC) is deactivated as a result of turning off of an ignition IG of the vehicle, to thus bring the operation clock signal CLK into an OFF state.

The master unit 26 and the slave units 14, 16, 18, 20, 22, and 24 are specifically built from microcomputers.

Figure 2:
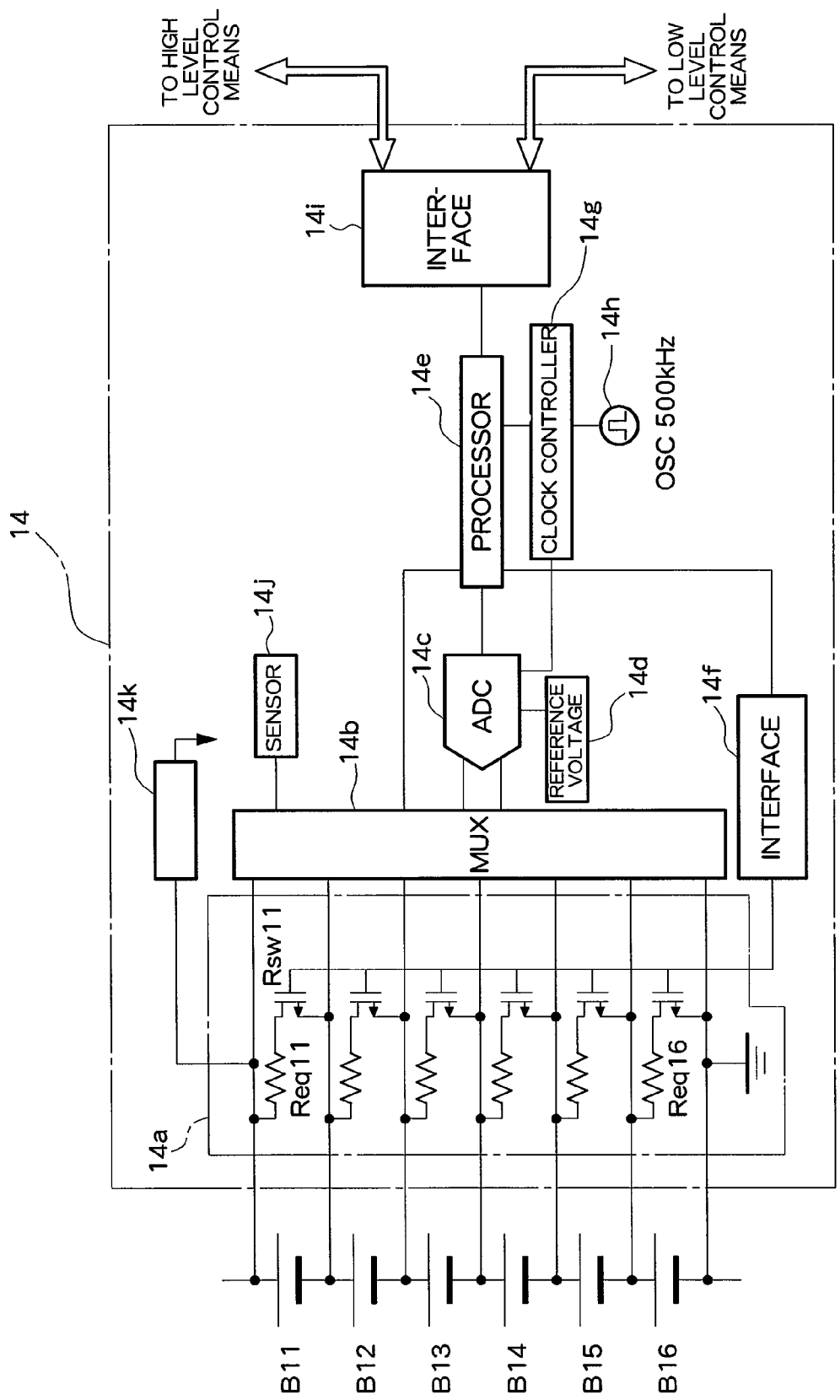
FIG. 2 is a structural block diagram of a slave unit shown in FIG. 1.

FIG. 2 shows a structural block diagram of the slave unit 14 shown in FIG. 1. The other slave units 16, 18, 20, 22, and 24 also have the same configuration.

The slave unit 14 has a discharge circuit 14a, a multiplexer (MUX) 14b, an analogue-to-digital converter (ADC) 14c, an oscillator (OSC) 14h, a clock controller 14g, a processor 14e, and interfaces 14f and 14i.

The slave unit 14 operates upon receipt of a power supply from the block B1 that is an object of management. The other slave units 16, 18, 20, 22, and 24 also have a similar configuration. However, the master unit 26 receives a power supply from an auxiliary power source that is a system differing from a power system for the battery pack 10.

The discharge circuit 14a causes the respective battery cells B11 to B16 of the block B1 to discharge, thereby equalizing the state of charge SOC(%) (which is also hereinafter referred to simply as "state of charge" as appropriate) of the respective battery cells B11 to B16. The discharge circuit 14a has a resistor Req connected to positive terminals of the respective battery cells and a switching transistor Rsw connected to the resistor. A collector terminal of the switching transistor Rsw is connected to the resistor, and an emitter terminal of the same is connected to negative terminals of the battery cells. A base terminal of the switching transistor is connected to a processor 14e by way of an interface 14f. When attention is paid to; for instance, the battery cell B11, a resistor Req 11 is connected to the positive terminal of the battery cell B11. The collector terminal of a switching transistor Rsw 11 is connected to the resistor Req 11. The emitter terminal of the switching transistor Rsw 11 is connected to the negative terminal of the battery cell B11. The base terminal of the same is connected to the processor 14e. When the switching transistor Rsw is turned on by a control signal from the processor 14e, the positive terminals and the negative terminals of the respective battery cells are short-circuited by way of the resistor Req. For instance, when the switching transistor Rsw 11 is turned on, the positive terminal and the negative terminal of the battery cell B11 are connected to each other by way of the resistor Req 11, whereupon the battery cell B11 is discharged. The discharge circuit 14a individually causes the battery cells B11 to B16 to perform a discharge by use of the resistor Req and the switching transistor Rsw connected to each of the battery cells. As a result of the battery cells B11 to B16 being subjected to electric discharge, the state of charge (SOC) of the battery cells can be changed, whereupon the state of charge (SOC) can eventually be equalized. For instance, the state of charge (SOC) of the battery cell B11 is higher than the state of charge (SOC) of the other battery cells, the battery cell B11 is subjected to electric discharge, whereby the state of charge (SOC) of the battery cell is reduced. Equalization of the state of charge (SOC) can also be performed on a per-block basis. For instance, the state of charge (SOC) of the block B1 is higher than the state of charge of the other blocks, the battery cells B11 to B16 making up the block B1 are subjected to electric discharge, thereby diminishing the state of charge (SOC) of the block. When the battery pack 10 is built in a motor vehicle, such as a hybrid electric vehicle and a pure electric vehicle, processing for equalizing the state of charge (SOC) is performed during halting of the vehicle; namely, after turning off of the ignition.

When the vehicle ignition is turned off, the master unit 26 outputs an equalization processing execution command to the respective slave units 14, 16, 18, 20, 22, and 24. In response to the command from the master unit 26, the processor 14e of the slave unit 14 controls activation and deactivation of the respective switching transistors Rsw of the discharge circuit 14a, thereby controlling an electric discharge. The master unit 26 determines performance and nonperformance of equalization processing according to the terminal voltages V11 to V66 supplied from the respective slave units 14, 16, 18, 20, 22, and 24. Specifically, a state of charge (SOC) is computed for each of the blocks B1 to B6 from the terminal voltages V11 to V66, thereby determining whether or not variations exist in the thus-computed state of charge (SOC). When variations are determined to exist, a block to be subjected to an electric discharge is selected form the blocks B1 to B6 so as to eliminate the variations, and the command is sent to the respective slave units 14, 16, 18, 20, 22, and 24. Computation of the state of charge (SOC) of the respective blocks B1 to B6, determination of existence of variations, and performance/nonperformance of equalization processing are carried out when the master unit 26 turns on the ignition. The respective slave units 14, 16, 18, 20, 22, and 24 perform actual equalization processing after turning off of the ignition.

As mentioned previously, the salve unit 14 detects the terminal voltages V11 to V16 of the battery cells B11 to B16 in the block B1. The thus-detected terminal voltages V11 to V16 are supplied to the multiplexer (MUX) 14b.

A sensor 14j is a temperature sensor that detects a temperature of an IC chip of the slave unit 14 and supplies the temperature as a band gap voltage to the multiplexer 14b.

The multiplexer (MUX) 14b supplies these terminal voltages V11 to V16 and the chip temperature to the analogue-to-digital converter (ADC) 14c. By use of a reference voltage Vref from a reference voltage generator 14d and an operation clock signal supplied to the clock controller 14g, the analogue-to-digital converter (ADC) 14c converts the analogue terminal voltages V11 to V16 into digital voltage data V11 to V16 at the timing commanded by the voltage acquisition signal from the processor 14e, and outputs the digital voltage data as serial data to the processor 14e. Moreover, a band gap voltage measured by the sensor 14j is also converted into digital temperature data, and the digital temperature data are supplied to the processor 14e.

The processor 14e causes the analogue-to-digital converter (ADC) 14c to operate in response to the voltage acquisition signal supplied from the master unit 26 by way of the interface 14i, thereby acquiring the digital voltage data V11 to V16 and the digital temperature data pertaining to a chip; and outputs the thus-acquired data to a low level slave unit, or the slave unit 16 in the embodiment, by way of the interface 14i. The processor also activates the discharge circuit 14a by way of the interface 14f in response to an equalization command signal supplied from the master unit 26 by way of the interface 14i. The processor 14e operates by use of the operation clock signal CLK that has been generated by the oscillator (OSC) 14h and subjected to frequency division by the clock controller 14g. The operation clock signal CLK is brought into on or off according to turning on or off of the ignition. Specifically, when the ignition is turned on, the processor 14e operates according to the operation clock signal CLK. On the contrary, when the ignition is turned off, the operation clock signal CLK is also turned off, whereupon operation of the processor 14e comes to a stop.

As mentioned above, in response to the command from the master unit 26, the slave units 14, 16, 18, 20, 22, and 24 provided for the respective blocks B1 to B6 acquire the terminal voltages and chip temperatures of the blocks B1 to B6 managed by the slave units and supply the thus-acquired voltages and the temperatures to the master unit 26. However, the respective slave units 14, 16, 18, 20, 22, and 24 are not always identical with each other in terms of electric power consumption. Electric power consumption can change according to variations in processes for manufacturing the slave units 14, 16, 18, 20, 22, and 24, variations in an oscillation frequency of the slave units 14, 16, 18, 20, 22, and 24, and variations in the chip temperatures of the slave units 14, 16, 18, 20, 22, and 24. The respective slave units 14, 16, 18, 20, 22, and 24 operate by means of power from the respective blocks B1 to B6 managed by the slave units. Therefore, when variations arise in the electric current consumed by the slave units 14, 16, 18, 20, 22, and 24, variations will arise in amounts of electricity consumed even if the respective slave units 14, 16, 18, 20, 22, and 24 have operated in the same manner, so that the state of charge (SOC) of the respective blocks B1 to B6 will also change.

Figure 3:
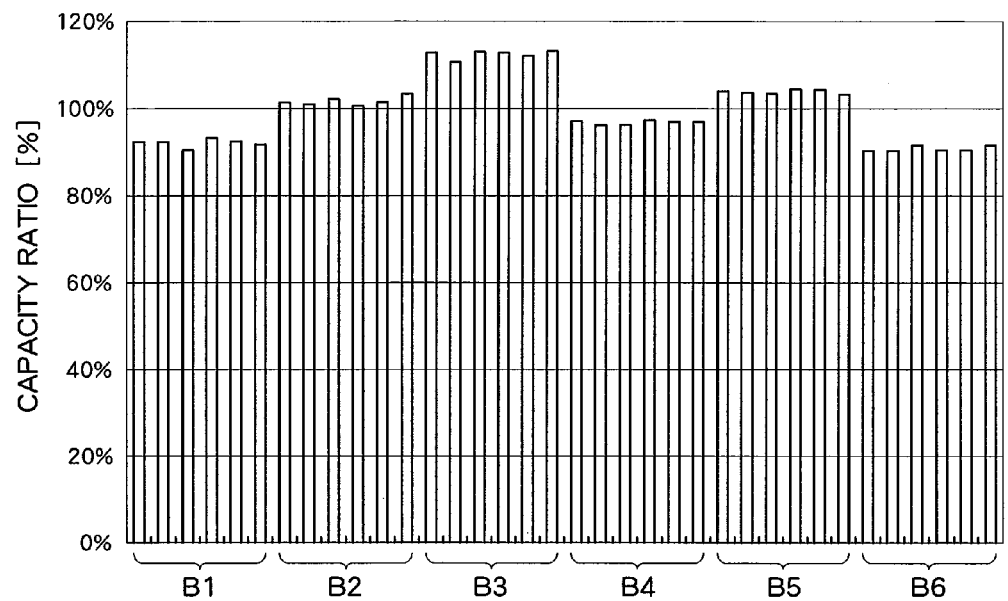
FIG. 3 is a graph showing an SOC (a relative ratio) of each of blocks.

FIG. 3 shows a distribution of state of charge (SOC) of the respective blocks B1 to B6 achieved after the vehicle equipped with the battery pack 10 has traveled over a given distance. A horizontal axis shows the battery cells B11 to B66 provided in the respective blocks B1 to B6, and a vertical axis shows a relative ratio of state of charge (a capacity ratio) acquired when an average of SOC values of all the blocks is taken as 100. The capacity ratios are understood to be B3>B2, B4, B5>B1, B6, and variations are understood to have arisen in the state of charge (SOC) of the blocks B1 to B6. When variations arise on a per-block basis, a range of the SOC available for discharging and recharging of the battery pack 10 is determined from the maximum SOC and the minimum SOC of the battery cells. Therefore, a charging and discharging characteristic of the battery pack is limited. As a consequence, utilization efficiency of the battery pack is also deteriorated. Such variations in the state of charge are caused by variations in the battery cells themselves (i.e., an individual difference of each battery cell). However, the variations in the state of charge are further ascribable to differences among the slave units 14, 16, 18, 20, 22, and 24 in the respective blocks in terms of electric power consumption, such as those mentioned above.

Accordingly, the present embodiment is based on the assumption that differences exist in electric power consumption of the slave units 14, 16, 18, 20, 22, and 24. In order to lessen variations in the state of charge (SOC) of the respective blocks B1 to B6 stemming from differences in electric power consumption, timing for turning off the respective slave units 14, 16, 18, 20, 22, and 24 at the time of halting of the vehicle is controlled.

Figure 4:
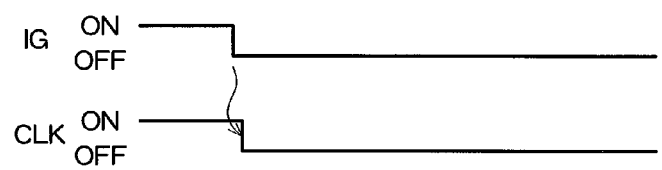
FIG. 4 is a clock signal timing chart of related-art slave units.

FIG. 4 shows activation timings of the slave units 14, 16, 18, 20, 22, and 24 of a related-art battery pack manager for comparison purpose. When the ignition IG of the vehicle changes from the turn-off position to the turn-on position as a result of halting of the vehicle, the oscillators 14h of the respective slave units 14, 16, 18, 20, 22, and 24 are also stopped in conjunction with turning off of the ignition, so that the operation clock signal CLK is also brought into an off state.

Figure 5:
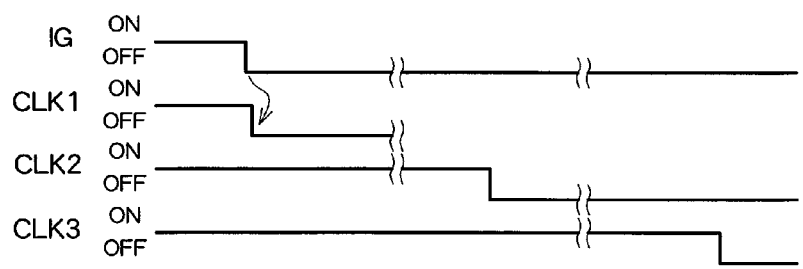
FIG. 5 is a clock signal timing chart of the slave units of the present embodiment.

Meanwhile, FIG. 5 shows activation timings of the slave units 14, 16, 18, 20, 22, and 24 of the embodiment. In the drawing, an operation clock signal CLK 1 is an operation clock signal for the salve units 14 and 24 respectively managing the blocks B1 and B6. An operation clock signal CLK2 is an operation clock signal for the slave units 16, 20, and 22 respectively managing the blocks B2, B4, and B5. An operation clock signal CLK3 is an operation clock signal for the slave unit 18 managing the block B3. When the ignition IG of the vehicle has changed from the turn-on position to the turn-off position as a result of halting of the vehicle, the operation clock signal CLK1 immediately deactivates the slave units in conjunction with the change in state. However, the operation clock signal CLK2 is stopped after elapse of only a predetermined period of time t1 since the ignition IG was turned off. Further, the operation clock signal CLK3 is stopped after elapse of only a predetermined period of time t2 (t1<t2) since the ignition IG was turned off. During a period in which the operation clock signal is supplied, the slave units consume electric power. Therefore, the state of charge (SOC) of the block managed by the salve unit decreases correspondingly. Therefore, Amounts of electric power consumed by the slave unit 18 that is operated by the operation clock signal CLK3 are the largest. Amounts of electric power consumed by the slave units 16, 20, and 22 that are operated by the operation clock signal CLK 2 are the second largest. Amounts of electric power consumed by the slave units 14 and 24 that are operated by the operation clock signal CLK1 are the smallest. Specifically, a drop occurred in the state of charge (SOC) of the block B3 after halting of the vehicle is the largest. Next, a drop in the state of charge (SOC) of the blocks B2, B4, and B5 is the second largest. Finally, a drop in the state of charge (SOC) of the blocks B1 and B6 is a minimum. Consequently, the state of charge (SOC) of the respective blocks B1 to B6 is equalized.

In FIG. 5, the three operation clock signals CLK1 to CLK3 are assigned to the six slave units 14, 16, 18, 20, 22, and 24. However, each of the slave units 14, 16, 18, 20, 22, and 24 may also be assigned an operation clock signal, thereby determining activation timings of the respective slave units.

For instance, operation clock signals may be assigned as follows, thereby setting deactivation timings of the operation clock signals CLK1 to CLK6 incidental to turning off of the ignition IG of the vehicle.

Slave unit 14: the operation clock signal CLK1
Slave unit 16: the operation clock signal CLK2
Slave unit 18: the operation clock signal CLK3
Slave unit 20: an operation clock signal CLK4
Slave unit 22: an operation clock signal CLK5
Slave unit 24: an operation clock signal CLK6

A rule for setting deactivation timing is to delay deactivation timing much longer as a state of charge (SOC) achieved before halting of a vehicle is larger (greater). Deactivation timings of the operation clock signals can be determined by various methods under the set rule.

Figure 6:
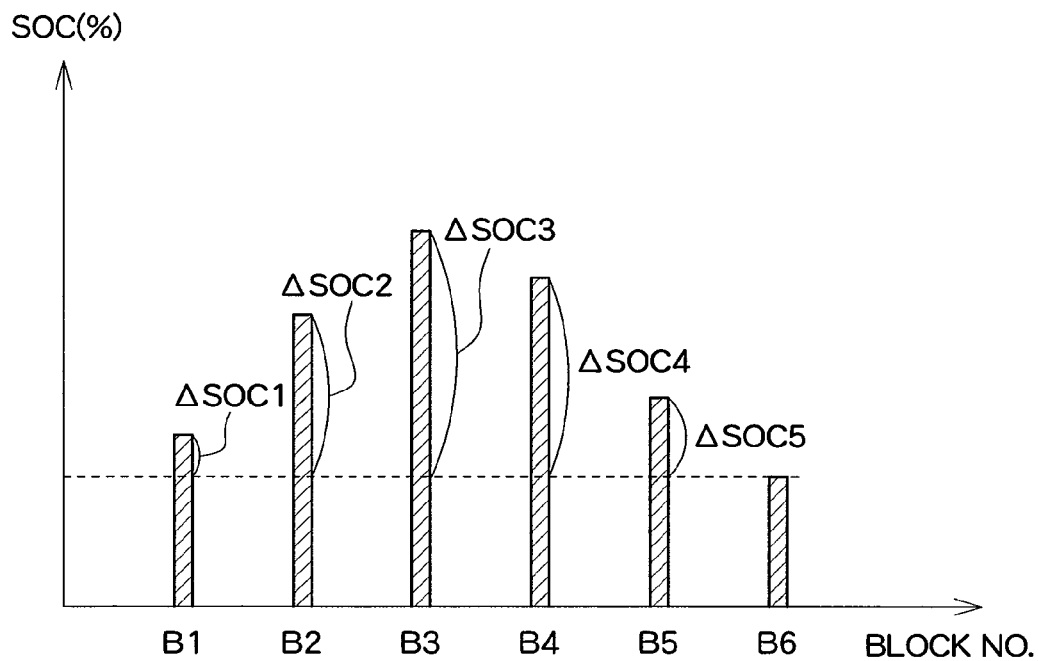
FIG. 6 is another graph showing an SOC (%) of each of the blocks.
Figure 7:
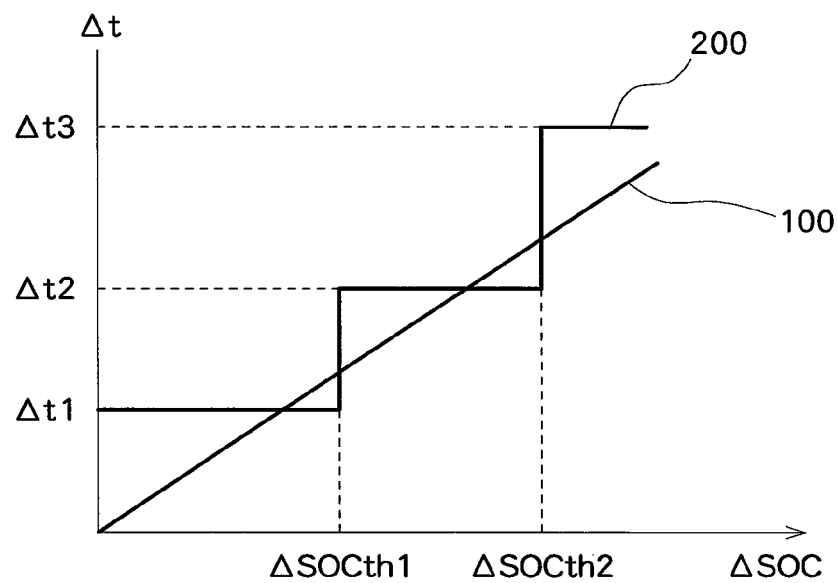
FIG. 7 is a graph showing a relationship between a delay time Δt and a difference ΔSOC between the SOC levels of the blocks.

FIGS. 6 and 7 show an example method for determining deactivation timings of the respective operation clock signals CLK1 through 6. FIG. 6 shows a state of charge (SOC) of the respective blocks B1 to B6 achieved before halting of the vehicle. A block exhibiting the smallest state of charge (SOC) (the block B6 in the illustrated embodiment) is selected from the blocks B1 to B6. A difference ΔSOC between the state of charge (SOC) of the block B6 taken as a reference and a state of charge (SOC) of another block is computed. As a consequence, there are derived Block B1: ΔSOC1
Block B2: ΔSOC2
Block B3: ΔSOC3
Block B4: ΔSOC4
Block B5: ΔSOC5

A delay in deactivation timing of the salve unit that manages the block exhibiting the smallest state of charge (SOC)

(the slave unit 24 managing the block B6 in the embodiment) is taken as zero, and a delay time in deactivation timing of each of the remaining slave units is taken as Δt. The delay time Δt is determined according to the thus-computed difference ΔSOC. Determination of the difference is performed by reference to a predetermined function or a two-dimensional table.

FIG. 7 shows an example function that specifies a relationship between the difference ΔSOC and the delay time Δt. A graph 100 shows a linear function, and a graph 200 shows a stair-like function. In relation to the graph 200, a uniform delay time Δt1 is employed before the difference ΔSOC reaches to a first threshold value ΔSOCth1. Another uniform delay time Δt2 is employed before the difference ΔSOC changes from the first threshold value ΔSOCth1 to a second threshold value ΔSOCth2. A still another uniform delay time Δt3 is employed, so long as the difference ΔSOC is the second threshold value ΔSOCth2 or more. In any of the cases, the delay time Δt is increased with an increase in the difference ΔSOC. A correlation between the difference ΔSOC and the delay time Δt shown in FIG. 7 is previously stored in memory of the master unit 26 or another storage device.

Figure 8:
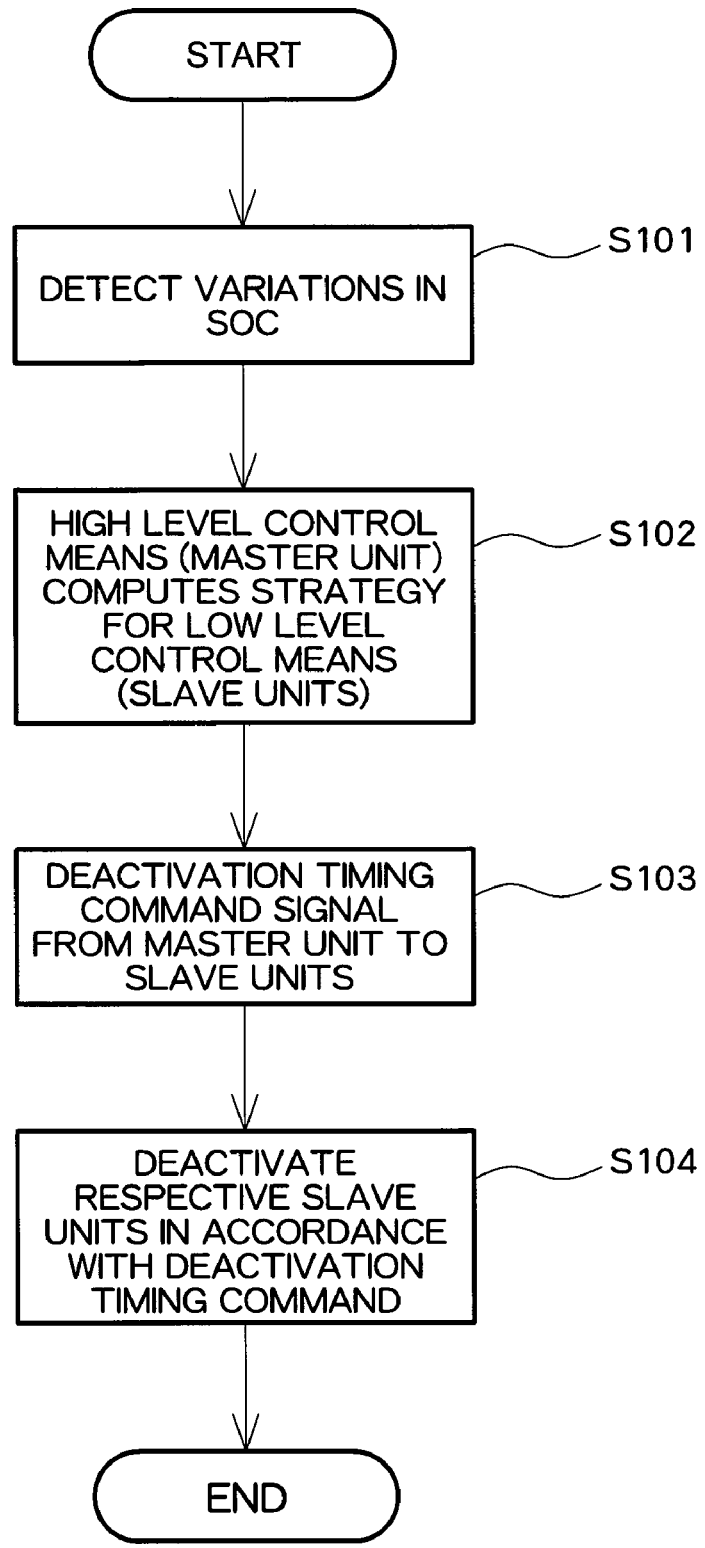
FIG. 8 is a processing flowchart of the master unit of the embodiment.

FIG. 8 shows a flowchart of processing of the master unit 26 in the embodiment. First, the master unit 26 detects the terminal voltages V11 to V66 of the respective battery cells B11 to B66 supplied from the respective slave units 14, 16, 18, 20, 22, and 24. The master unit then detects a state of charge (SOC) of the respective blocks from the terminal voltages and variations in the state of charge, too (S101). An essential requirement to detect the state of charge (SOC) from the terminal voltage is to previously store a relationship between a terminal voltage and a state of charge (SOC) in the memory of the master unit 26 and determine a state of charge (SOC) corresponding to the terminal voltage detected by use of the relationship. Alternatively, variations in the state of charge (SOC) may also be predicted rather than detection of variations in the state of charge (SOC). Specifically, so long as there are detected differences existing among the respective slave units 14, 16, 18, 20, 22, and 24 in terms of electric power consumption before factory shipment, the differences are ascertained. Therefore, magnitude of possible variations may also be predicted from the thus-ascertained differences. Moreover, since the oscillation frequency of the oscillators OSC14h have temperature characteristics, variations may also be predicted in additional consideration of the chip temperatures detected by the sensor 14j.

After detecting variations in the state of charge (SOC) of the respective blocks B1 to B6, the maser unit 26 serving as high level control means computes a strategy for the slave units 14, 16, 18, 20, 22, and 24 serving as low level control means; namely, deactivation timings employed at the time of halting of the vehicle (S102). Example computation is for computing the delay time Δt of deactivation timings of the respective slave units 14, 16, 18, 20, 22, and 24 as a function of the difference ΔSOC showing a degree of variation, as mentioned previously.

After computing the strategy for the slave units 14, 16, 18, 20, 22, and 24, the master unit 26 outputs the deactivation timing command to the respective slave units 14, 16, 18, 20, 22, and 24 (S103). In response to the deactivation timing command, the respective slave units 14, 16, 18, 20, 22, and 24 stop their operations (S104).

As mentioned above, in the embodiment, when variations have arisen in the state of charge (SOC) of the respective blocks B1 to B6 for reasons of differences, in terms of electric power consumption, among the slave units 14, 16, 18, 20, 22, and 24 managing the respective blocks B1 to B6, the deactivation timing of the slave unit that manages the block exhibiting a higher state of charge (SOC) is delayed much longer in conjunction with turning off of the ignition to actively decrease the state of charge (SOC) of the block, thereby making it possible to lessen or eliminate the variations.

Figure 9:
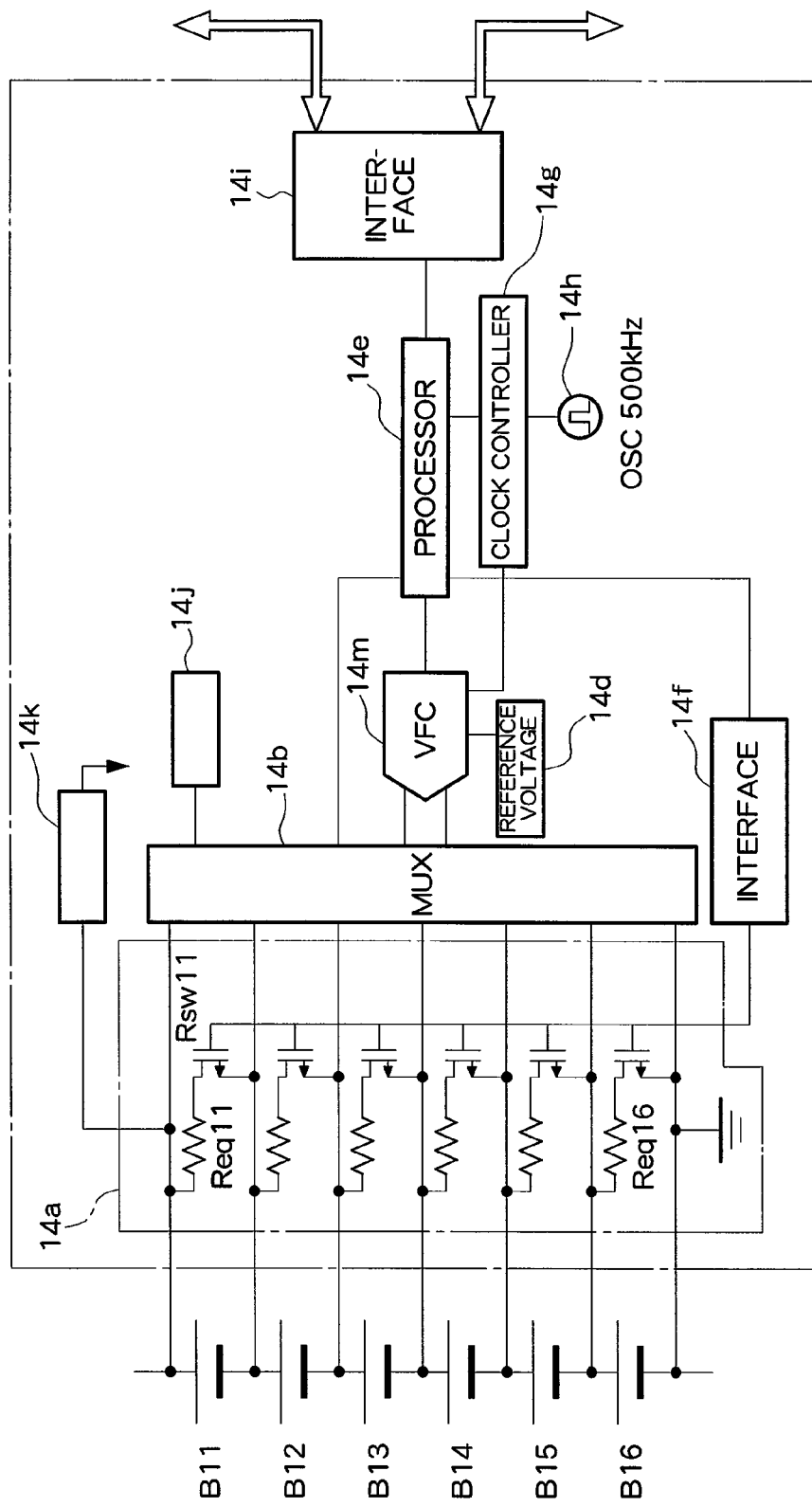
FIG. 9 is another structural block diagram of the slave unit shown in FIG. 1.

In the embodiment, each of the slave units 14, 16, 18, 20, 22, and 24 has the analogue-to-digital converter (ADC) 14c, as shown in FIG. 2. As shown in FIG. 9, a voltage-to-frequency converter (VFC) 14m can also be used in place of the analogue-to-digital converter.

A characteristic of the present embodiment lies not in forceful performance of electric discharge but in the ability to lessen or eliminate the variations in SOC by delaying deactivation timings of the respective slave units 14, 16, 18, 20, 22, and 24 incidental to turning off of the ignition. Specifically, in the present embodiment, operation of the discharge circuits 14a is not always necessitated. In this sense, the circuit configuration can be simplified by deleting the discharge circuits 14a. As a matter of course, the discharge circuits 14a may also be left and activated, as necessary, to thus forcefully perform electric discharge.

Processing of the embodiment is hereunder described in more detail.

Figure 10:
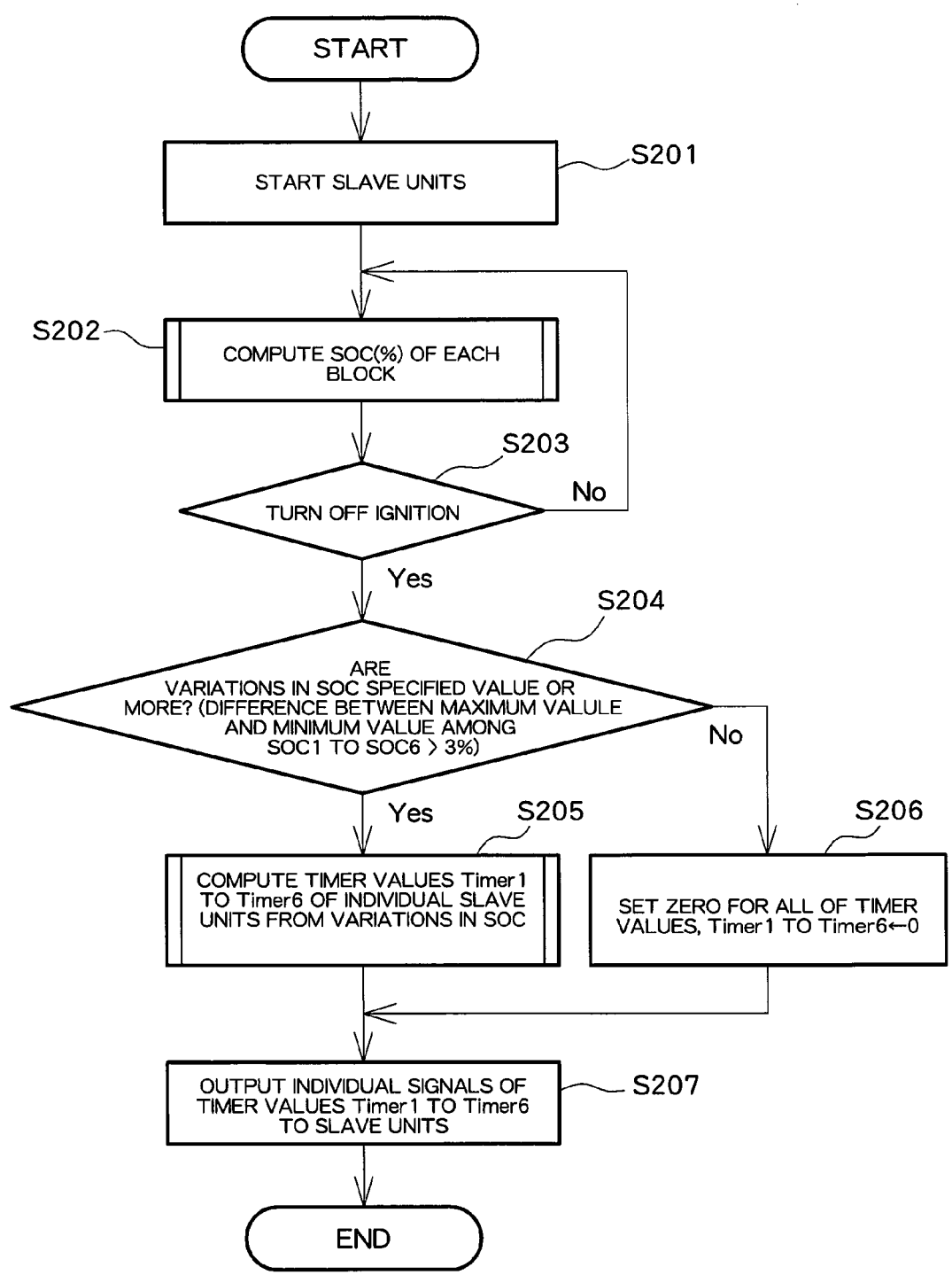
FIG. 10 is a detailed flowchart of a master unit of the embodiment.

FIG. 10 shows a processing flowchart of the master unit 26. Processing is that the master unit 26 transmits a timer value as a signal showing deactivation timing when the ignition is turned off. When the ignition is turned on, the master unit 26 transmits a startup signal by way of a communication channel, thereby starting the respective slave units 14, 16, 18, 20, 22, and 24 (S201) and outputting voltage and chip temperature acquisition signals to the slave units. Digital voltage data are received from the respective slave units 14, 16, 18, 20, 22, and 24, and the state of charge SOC(%) of each of the blocks B1 to B6 is computed (S202). Processing is repeatedly performed at a predetermined control period when the ignition is turned on.

When the ignition is turned off (Yes is selected in S203), the master unit 26 determines whether or not variations in the SOC are a specified value or more (S204). The determination can be made by extracting; for instance, the maximum value and the minimum value of the SOC of each of the blocks (SOC1 to SOC6) and determining whether or not a difference between the maximum value and the minimum value exceeds 3%. As a matter of course, a threshold value for the determination may arbitrarily be set. When variations in the SOC are the specified value or more, timer values Timer 1 to Timer 6 of the respective slave units 14, 16, 18, 20, 22, and 24 are computed from the variations in the SOC (S205), and the timer values Timer 1 to Timer 6 are output to the respective slave units 14, 16, 18, 20, 22, and 24 (S207). A timer value of the slave unit 14 is taken as Timer 1; a timer value of the slave unit 16 is taken as Timer 2; a timer value of the slave unit 18 is taken as Timer 3; a timer value of the slave unit 20 is taken as Timer 4; a timer value of the slave unit 22 is taken as Timer 5; and a timer value of the slave unit 24 is taken as Timer 6. Each of the slave units 14, 16, 18, 20, 22, and 24 has a CPU, and a timer made up of RAM is provided in each of the CPUs. The respective slave units 14, 16, 18, 20, 22, and 24 store into their respective RAMs the timer values Timer 1 to Timer 6 transmitted from the master unit 26.

Meanwhile, when the variations in the SOC are not the specified value or more, the master unit 26 sets all of the timer values Timer 1 to Timer 6 to zero (S206) and output the timer values Timer 1 to Timer 6 to the respective slave units 14, 16, 18, 20, 22, and 24 (S207).

Figure 11:
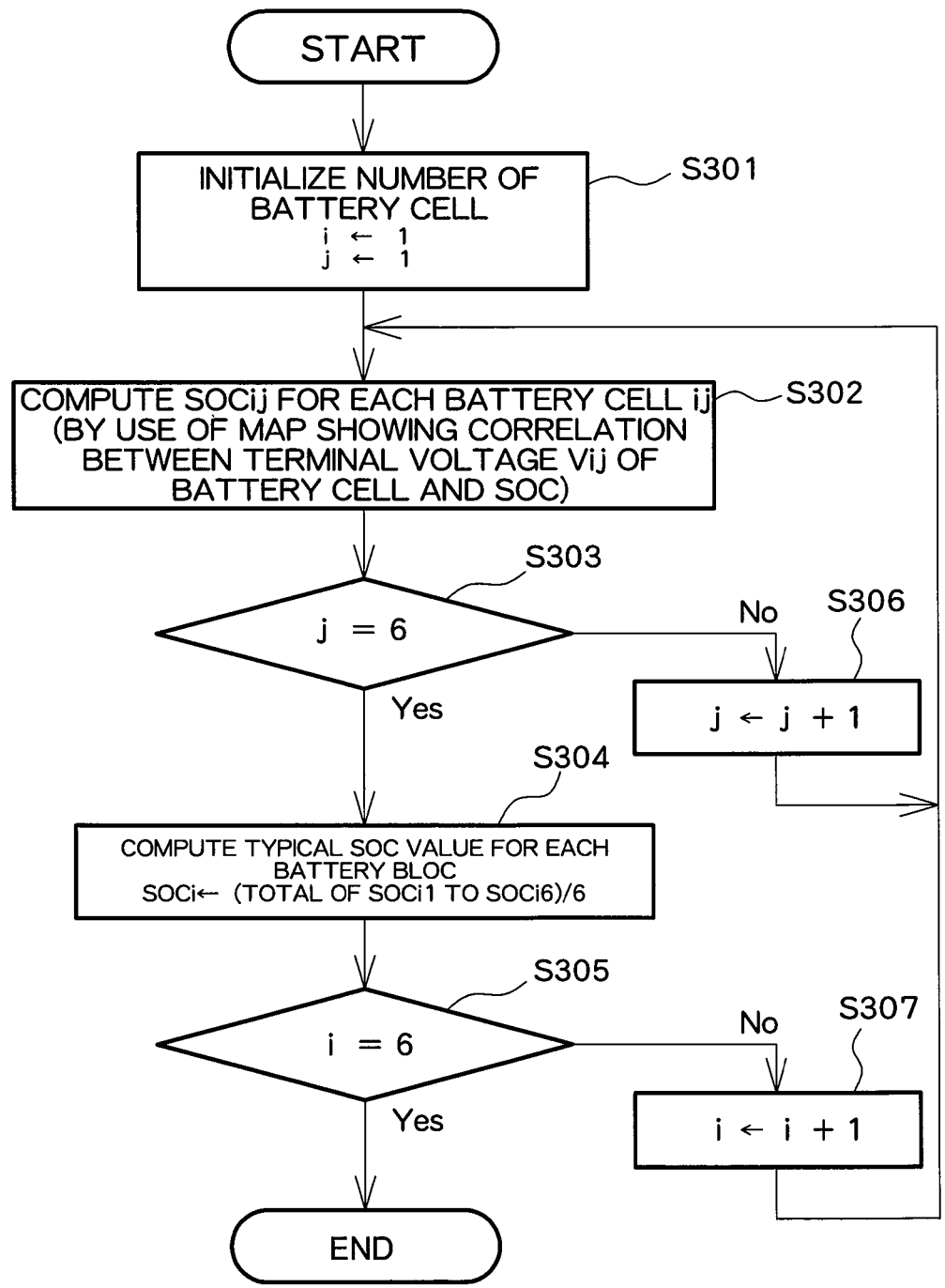
FIG. 11 is a detailed flowchart of processing pertaining to S202 shown in FIG. 10.

FIG. 11 shows a detailed flowchart of processing pertaining to S202 shown in FIG. 10; namely, processing for computing an SOC of the respective blocks B1 to B6. The master unit 26 first performs initial processing (S301). Specifically, a battery cell is designated by Bij, and an SOC of the battery cell is designated by SOCij, and both a block number "i" and a battery cell number "j" are initialized to one.

The master unit 26 then outputs a voltage acquisition signal to each of the slave units and receives digital voltage data from each of the slave units. Next, an SOCij of each battery cell Bij is computed by use of a map showing a correlation between a terminal voltage Vij of the battery cell and an SOC (S302). It is then determined whether or not the battery cell number "j" is six (S303). When the battery cell number "j" is not six, the battery cell number "j" is incremented by one (S306). Analogous processing is thus iterated. SOC11 to SOC16 of the battery cells B11 to B16 are thereby calculated through iterated performance of processing.

The master unit 26 then computes a typical SOC value of each battery block. Specifically, an average value of SOCi1 to SOCi6 of the battery cells making up each of the blocks is computed (S304). In the case of block number "i"=1, there is computed an average of SOC11 to SOC16 of the battery cells B11 to B16 making up the block B1. It is then determined whether or not the block number "i" is six (S305). When the block number "i" is not six, the block number "i" is incremented by one (S307), and analogous processing is iterated. Typical SOC1 to SOC6 of all blocks B1 to B6 are thus computed through processing.

Figure 12:
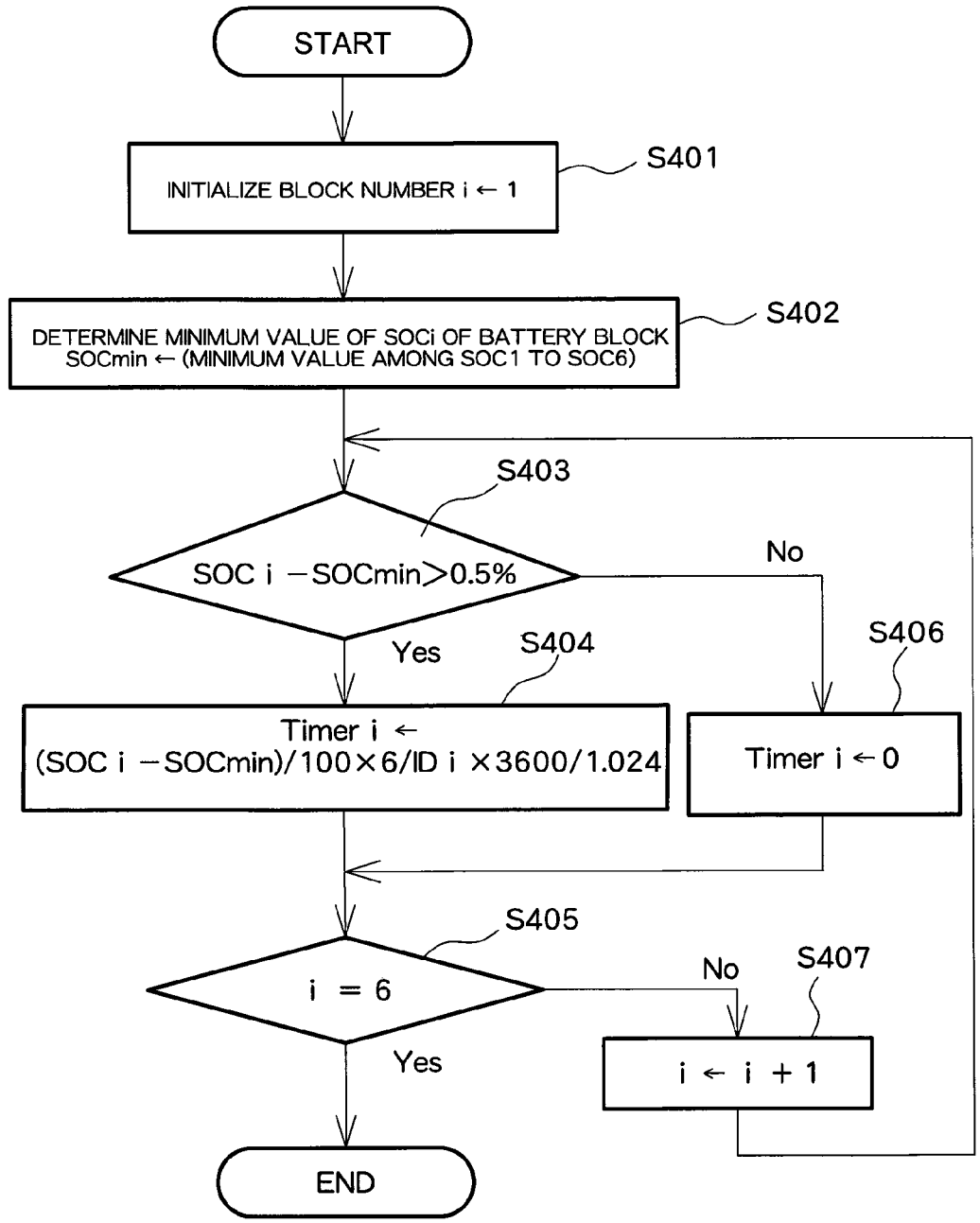
FIG. 12 is a detailed flowchart of processing pertaining to S205 shown in FIG. 10.

FIG. 12 shows a detailed flowchart of processing pertaining to S205 shown in FIG. 10; namely, processing for computing timer values of the respective slave units 14, 16, 18, 20, 22, and 24 from variations in SOC. First, the block number "i" equivalent to the slave number is initialized to one (S401), and the minimum value of SOCi of the block Bi is extracted (S402). The minimum value is taken as an SOCmin.

Next, a difference between the SOCi and the SOCmin is computed, and a determination is made as to whether or not the difference is smaller than a specified value (S403). For instance, it is determined whether or not the difference between the SOCi and the SOCmin is smaller than 0.5%. When the difference between the SOCi and the SOCmin is larger than the specified value, a timer value Timeri is computed by means of the following expression (S404).

$$Timeri = (SOCi - SOCmin)/100 \times 6/IDi \times 3600/1.024$$

Reference symbol IDi designates electric power consumption (A) of a slave unit given the block number "i." Electric power consumption is previously measured (at the time of factory shipment) and stored in memory of the master unit 26. The reason why the expression is multiplied by a value of six is that the capacity of the battery cell is 6Ah. Further, the expression is multiplied by a value of 3600 in order to convert a unit into a second. The reason why the expression is divided by a value of 1.024 is that the number of seconds per timer count is taken into account. As can be seen from the expression, the timer value Timeri is computed so as to increase in proportion to (SOCi−SOCmin).

Meanwhile, when the difference between the SOCi and the SOCmin is smaller than the specified value, the timer value Timeri is set to zero (S406). Setting the timer value Timeri to zero means that the slave unit is stopped immediately when the ignition is turned off.

Processing is iterated utile the block number "i" comes to six (S405 and 5407), whereby the timer values Timer1 to Timer6 of the respective slave units 14, 16, 18, 20, 22, and 24 are set.

Figure 13:
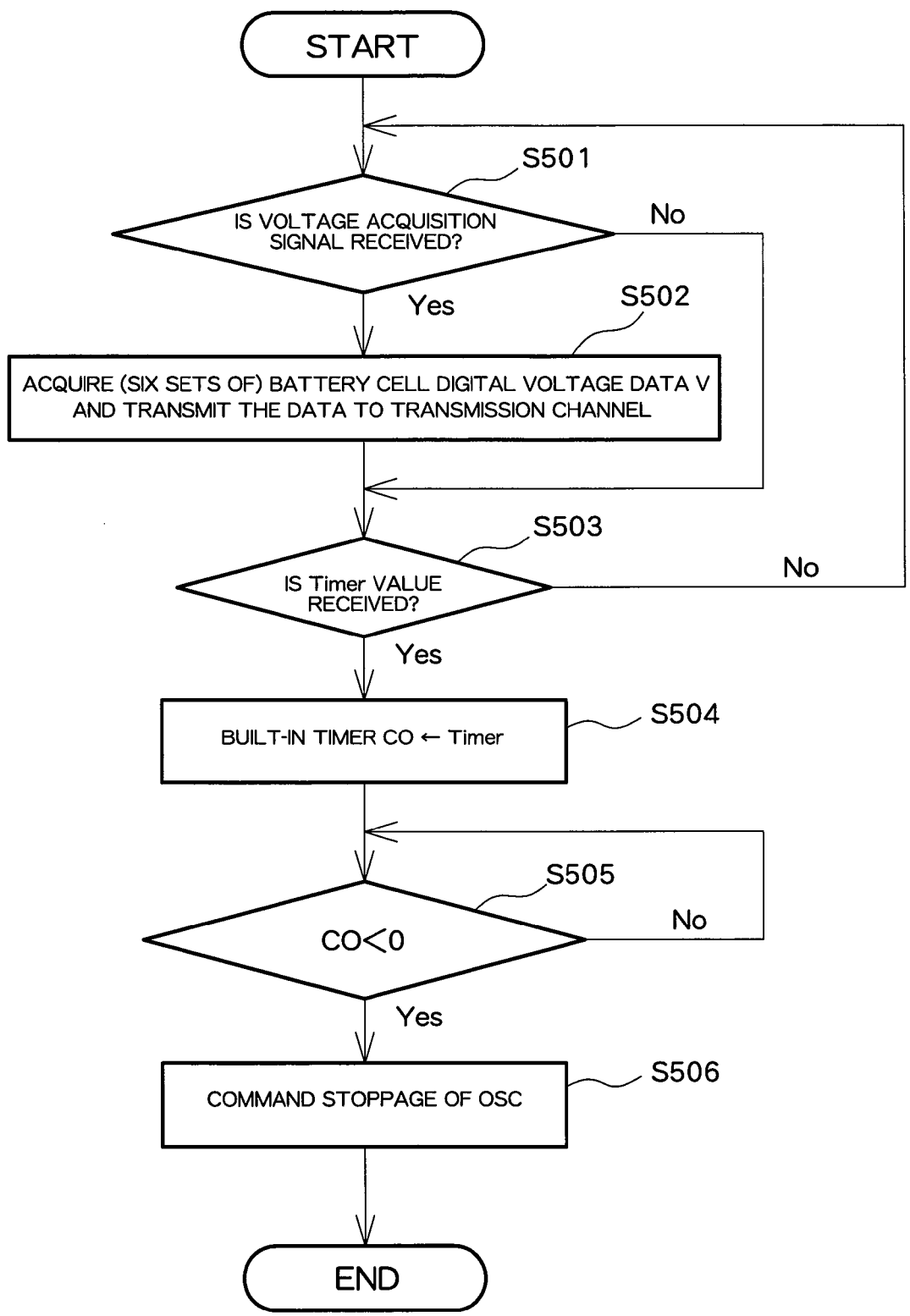
FIG. 13 is a detailed flowchart of the respective slave units of the present embodiment.

FIG. 13 shows a detailed flowchart for the respective slave units 14, 16, 18, 20, 22, and 24. Each of the slave units 14, 16, 18, 20, 22, and 24 determines whether or not the voltage acquisition signal is received from the master unit 26 (S501). When there is a request, digital voltage data are acquired, and the thus-acquired data are transmitted (S502). It is also determined whether or not the timer value Timer is received from the master unit 26 (S503). When the timer value Timer is received, the thus-received timer value is stored in a built-in timer C0 (S504). The built-in timer C0 performs a subtraction every $9^{th}$ power of 2 of an oscillatory frequency of the oscillator; namely, every 1.024 millimeters. It is determined whether or not the timer value C0 has come to an underflow; namely, whether or not the timer value has become smaller than zero (S505). When the timer value has become smaller than zero, the oscillator OSC is commanded to stop (S506).

Each of the processors of the respective slave units 14, 16, 18, 20, 22, and 24 does not need to be a microcomputer having a CPU. The processor can also be a state controller that uses an oscillator OSC as an operation clock.

Figure 14:
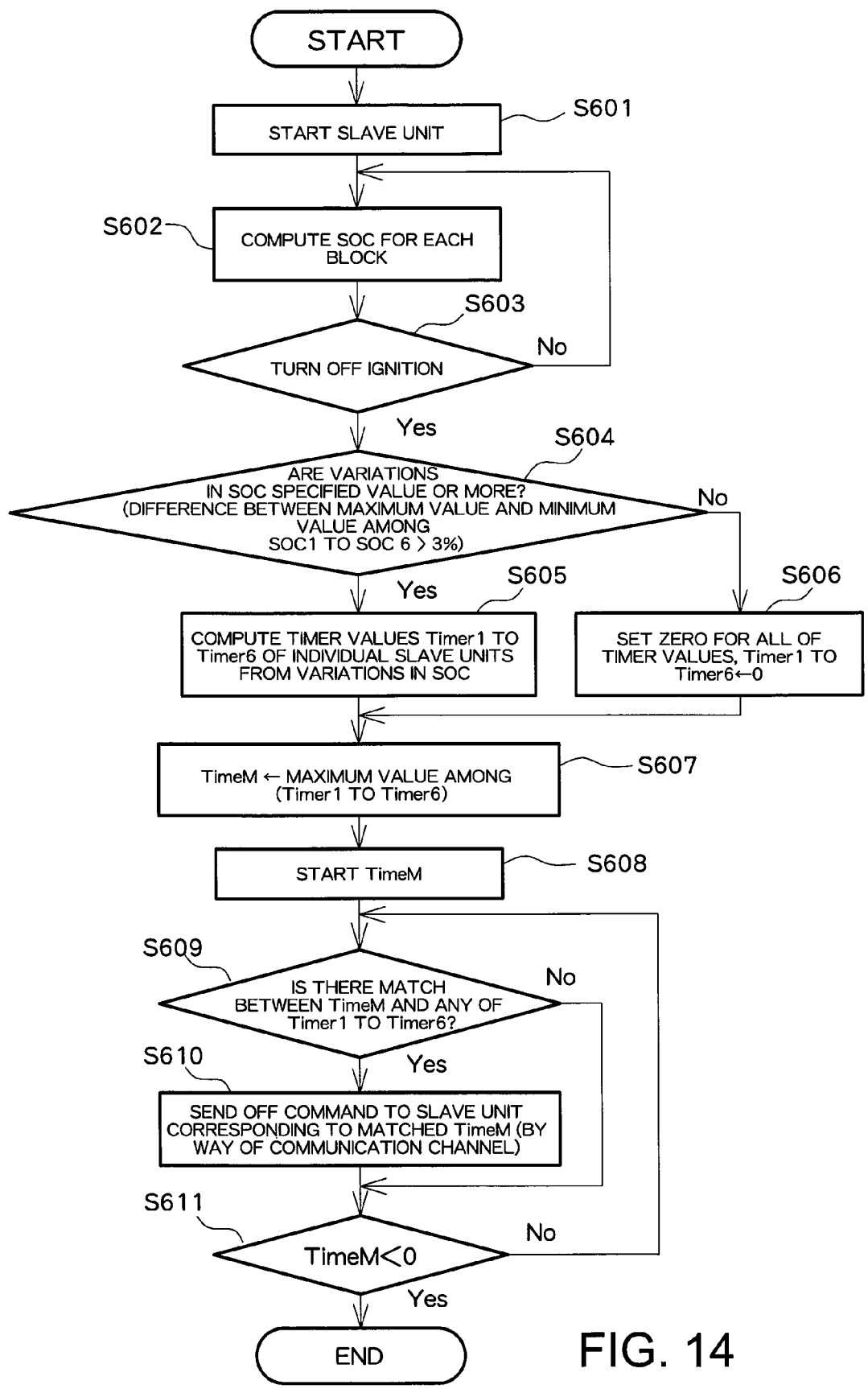
FIG. 14 is another detailed flowchart of the master unit of the present embodiment.

FIG. 14 shows another detailed flowchart of the master unit 26. FIG. 10 is based on the premise that each of the slave units 14, 16, 18, 20, 22, and 24 has the timer C0. The present embodiment shows a case where each of the slave units 14, 16, 18, 20, 22, and 24 does not need to have the timer C0.

In FIG. 14, processing pertaining to S601 to S606 is identical with processing pertaining to S201 to S206 in FIG. 10.

The master unit 26 then extracts the maximum timer value from the timer values Timer1 to Timer6 of each of the slave units 14, 16, 18, 20, 22, and 24 (S607) and sets the thus-extracted maximum value to a countdown timer TimeM of the master unit 26 and starts the timer (S608). During proceeding of a countdown, the master unit 26 determines whether or not a count value of the countdown timer TimeM matches any of the timer values Timer1 to Timer6 (S609). When a match takes place, a voltage acquisition signal is output to a slave unit corresponding to the thus-matched Timer, and an OFF command for turning off the operation clock signal CLK is subsequently output (S610). Processing is iterated until the timer TimeM comes to an underflow (S611). The master unit 26 subsequently stops its operation.

Figure 15:
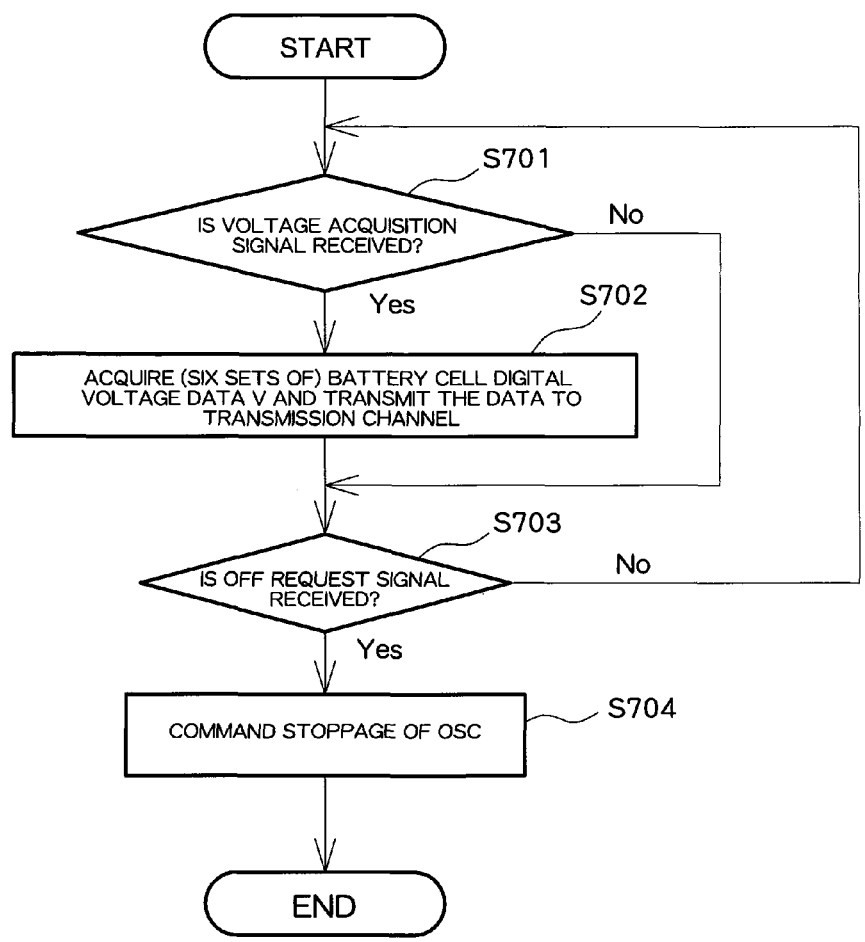
FIG. 15 is another detailed flowchart of the salve units of the present embodiment.

FIG. 15 shows a detailed flowchart for each of the slave units 14, 16, 18, 20, 22, and 24 employed in this case. Processing pertaining to S701 and S702 is analogous to processing pertaining to S501 and S502 in FIG. 13. When there is a request for a digital voltage, the request is acquired and transmitted to the master unit 26.

Each of the slave units 14, 16, 18, 20, 22, and 24 determines whether or not the OFF command from the master unit 26 is received (S703). When the OFF command is received, operation of the oscillator OSC is stopped (S704).

Figure 16:
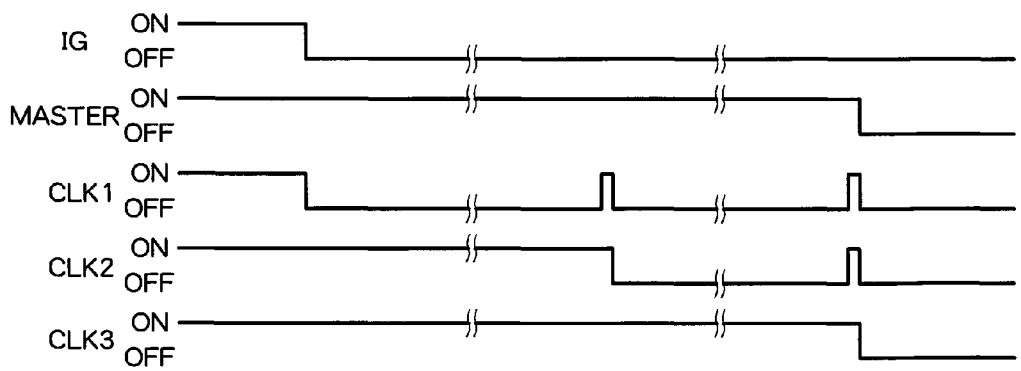
FIG. 16 is another clock signal timing chart of the respective slave units of the present embodiment.

FIG. 16 shows operation timing of the master unit 26 and operation timing of the respective slave units 14, 16, 18, 20, 22, and 24 achieved at this time. In the drawing, the operation clock signal CLK1 is an operation clock signal for use with the slave units 14 and 24 that respectively manage the blocks B1 and B6. The operation clock signal CLK2 is an operation clock signal for use with the slave units 16, 20, and 22 that respectively manage the blocks B2, B4, and B5. The operation clock signal CLK3 is an operation clock signal for use with the slave unit 18 that manages the blocks B3. The master unit 26 is held in the ON position until all of the slave units 14, 16, 18, 20, 22, and 24 come into the OFF position even when the ignition IG is turned off. The master unit 26 first outputs the OFF command to the slave units 14 and 24; next outputs the OFF command to the slave units 16, 20, and 22; and finally outputs the same to the slave unit 18. Further, since the slave units 14, 16, 18, 20, 22, and 24 are connected in the form of a daisy chain, the slave units 14, 16, 20, 22, and 24 are momentarily, temporarily turned on; for instance, when the master unit 26 outputs the OFF command to the slave unit 18.

The embodiment of the present invention has been described thus far. However, SOC(%) can also be taken as remaining capacity (Ah).

What is claimed is:

1. A manager that manages a state of charge of a battery pack, comprising:
   a plurality of low level control means that control a plurality of respective series-connected battery blocks making up the battery pack and that are supplied with electric power from the plurality of respective battery blocks; and
   high level control means that controls a delay time of deactivation timings of the plurality of respective low level control means incidental to turning off of an ignition subsequent to halting of a vehicle according to variations in state of charge of the battery blocks to be controlled respectively by the plurality of low level control means and that performs control such that the delay time increases with an increase in the state of charge.

2. The manager according to claim 1, wherein the plurality of low level control means detect terminal voltages of the battery blocks to be controlled respectively by the low level control means and supply the detected terminal voltages to the high level control means; and the high level control means detect variations in the state of charge according to the terminal voltages of the battery blocks.

3. The manager according to claim 1, further comprises:
   storage means that stores a correlation between a degree of variation in the state of charge of the battery pack and the delay time, wherein
   the high level control means controls respective deactivation timings of the plurality of low level control means by use of the correlation stored in the storage means.

4. The manager according to claim 1, wherein each of the plurality of low level control means has a timer, commences measurement by use of the timer when an ignition is turned off, and stops operation of the low level control means at a point in time when a timer value of the timer has come to a predetermined value; and
   the high level control means sets the predetermined value for each of the timers according to variations in the state of charge and supplies the set predetermined value to each of the low level control means.

5. The manager according to claim 4, wherein the high level control means extracts a minimum state of charge from a state of charge of the battery blocks to be controlled by the plurality of respective low level control means, computes a difference between the state of charge of the respective battery blocks and the minimum state of charge, and sets the predetermined value for each of the timers according to the thus-computed difference.

6. The manager according to claim 1, wherein the high level control means has a timer that commences measurement after the ignition is turned off and outputs a deactivation command to corresponding low level control means when the timer value of the timer has matched deactivation timing of each of the low level control means subsequent to turning off of the ignition set according to the variations in the state of charge.

7. The manager according to claim 6, wherein the high level control means extracts a minimum state of charge from a state of charge of the battery blocks to be controlled by the plurality of respective low level control means, computes a difference between the state of charge of the respective battery blocks and the minimum state of charge, and sets deactivation timing for each of the low level control means according to the thus-computed difference.

8. The manager according to claim 1, wherein deactivation of the plurality of low level control means corresponds to stoppage of an operation clock signal to the respective low level control means.

9. A manager that manages remaining capacity of a battery pack, comprising:
   a plurality of low level control means that control a plurality of series-connected battery blocks which make up the battery pack; and
   high level control means that controls a delay time of deactivation timing of each of the plurality of low level control means incidental to turning off of an ignition subsequent to halting of a vehicle according to variations in remaining capacity of the battery blocks to be controlled respectively by the plurality of low level control means and that performs control such that the delay time increases with an increase in the remaining capacity.

* * * * *